United States Patent [19]

Nardo et al.

[11] 3,795,888

[45] Mar. 5, 1974

[54] PRINTED CIRCUIT BOARD EDGE CONNECTOR REQUIRING ZERO INSERTION FORCE

[75] Inventors: Frank L. Nardo; Edward A. Salners, both of Mt. Prospect, Ill.

[73] Assignee: Motorola, Inc., Franklin Park, Ill.

[22] Filed: June 30, 1972

[21] Appl. No.: 267,772

[52] U.S. Cl. .......................... 339/176 MP, 339/17 L

[51] Int. Cl. ............................................ H05k 1/07

[58] Field of Search... 339/17 L, 17 LC, 17 LM, 65, 339/75 MP, 176 MP, 184 M, 186 M, 210 M

[56] References Cited

UNITED STATES PATENTS 3,701,071 10/1972 Landman ................ 339/176 MP X

*Primary Examiner*—Joseph H. McGlynn

*Assistant Examiner*—Lawrence J. Staab

*Attorney, Agent, or Firm*—Vincent J. Rauner; Donald B. Southard

[57] ABSTRACT

An edge connector for a printed circuit board or the like wherein substantially zero insertion force is required upon inserting such circuit board at a predetermined angle to the connector body, but wherein when the circuit board is pivoted to a substantially horizontal position, contact spring members included in the connector device engage conventional connection tabs positioned along the inserted edge of the printed circuit board to establish an optimum low resistance connection therebetween. Three embodiments of the edge connector device are shown and described.

2 Claims, 6 Drawing Figures

PRINTED CIRCUIT BOARD EDGE CONNECTOR REQUIRING ZERO INSERTION FORCE

BACKGROUND OF THE INVENTION

This invention relates in general to multiple electrical contact connectors and, more particularly, to the type for interconnecting a plurality of electrical components, such as may be incorporated on a printed circuit board or other panel-like device, with other circuitry in the particular electrical apparatus.

Conventional printed circuit wiring techniques have given rise to the adoption of specialized electrical connector devices, one specie of which may be referred to as edge connectors. These referenced devices generally comprise a support framewith an opening of one sort or another for receiving a portion, or edge, of the associated printed circuit board therein. The connector assembly customarily includes a plurality of contacts arranged in some manner such that upon insertion of the printed circuit board electrical continuity is effectively established between the connector contacts and conducting paths or strips defined in the board. Usually, these contacts are spring loaded or otherwise resiliently pressed against the printed circuit board being inserted in the connector body so that an appropriate contact force is developed to hold the board and connector together as a composite unit. Further, the force developed must be of such magnitude to insure that a sufficient low resistance connection is established and maintained between the printed circuit board conductive strips or paths and the resilient contacts of the connector itself.

As a consequence of this relatively high contact pressure, a wear problem more often than not develops regarding the contact surfaces and/or associated printed circuit board conductive surfaces. Moreover, it is often difficult to insert and properly align the printed circuit board within the connector body in the face of this inherent clamping force. The board frequently becomes wedged in a sidewise position and considerable effort and time is often required to effect its removal and reinsertion in the required correct alignment. Still another difficulty is frequently encountered due to a lack of uniformity in the thickness dimensions of such printed circuit boards. An increase in the thickness of such boards will result in still higher contact or clamping forces exerted and further compound problems. A decrease in the board thickness past a given point simply will not generate the required low resistance connection.

Accordingly, it is an object of the present invention to provide a printed circuit board edge connector which overcomes the foregoing deficiencies.

A more particular object of the present invention is to provide a printed circuit board edge connector assembly which requires substantially zero insertion force but which nevertheless insures the maintenance of a good electrical connection of optimized low resistance.

Still another object of the present invention is to provide a printed circuit board edge connector of the foregoing type requiring zero insertion force which may accommodate printed circuit boards of differing thickness dimensions and still maintain good electrical connection therebetween.

Yet another object of the present invention is to provide a printed circuit board edge connector of the foregoing type wherein the printed circuit board, when maintained at a particularized attitude relative to the connector assembly, may be inserted therein with substantially zero insertion force and wherein the board may be moved to a different position to establish good electrical connection and lock the same in a desired fixed position.

SUMMARY OF THE INVENTION

In practicing the invention a printed circuit board edge connector assembly is provided having a body with a longitudinal slot or access opening therein for receiving an edge portion of the printed circuit board to be connected. The printed circuit board edge includes a plurality of conductive paths or strips running essentially parallel to one another in one direction along one axis of the printed circuit board. The connector body includes a plurality of resiliently mounted spring members serving as the contacts for establishing electrical continuity therebetween and respective ones of the printed circuit board conductive strips. The connector body slot opening and the plurality of spring contacts are arranged in a manner wherein the printed circuit board, when held at a particular angle or attitude relative to the connector body, will effectively clear the spring contacts and thus may be inserted within the connector body with substantially zero insertion force. When the printed circuit board is pivoted to a position substantially normal to the connector body, the conductive strips on the edge of the printed circuit board are moved into good electrical contact with associated ones of the spring contacts. Suitable means may then be utilized to lock the printed circuit board in this position. In this way, the abrasive wear on electrical contact surfaces when slid over one another is effectively avoided, reliability and service life is thereby substantially increased, and tolerances, such as the thickness of the associated printed circuit board, may be relaxed to a large degree.

BRIEF DESCRIPTION OF THE DRAWINGS

The features of the present invention which are believed to be novel are set forth with particularity in the appended claims. The invention itself, however, together with further objects and advantages thereof, may be best understood by reference to the accompanying drawings, in which;

DETAILED DESCRIPTION

Figure 1:
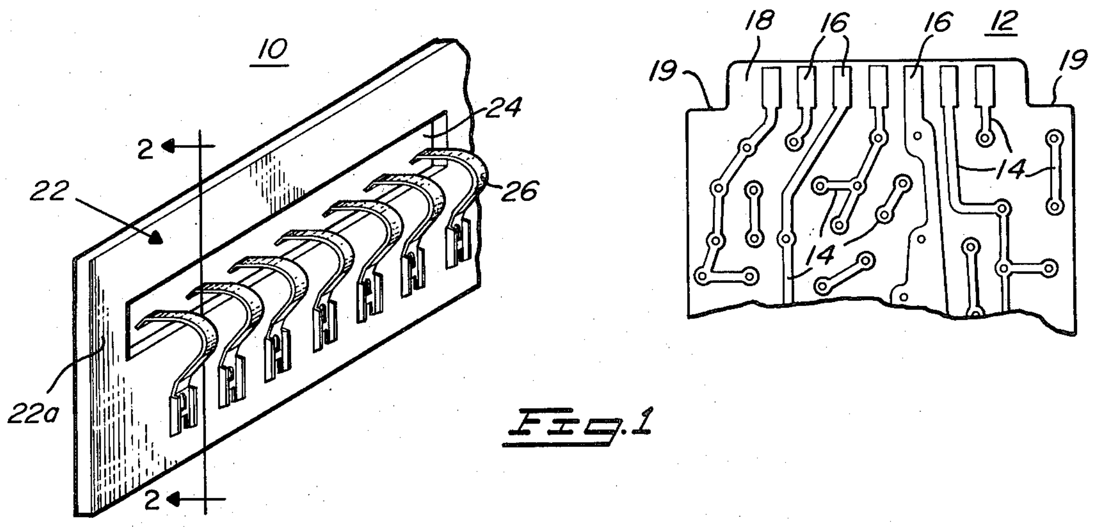
FIG. 1 is a partial bottom plan view of a printed circuit board together with a connector assembly in perspective which has been constructed in accordance with the present invention.

Referring now to the drawings, a connector assembly is shown generally at 10 in FIG. 1 which incorporates the principles of the present invention. Connector 10 is of the type intended for interconnecting a plurality of electrical components mounted on a printed circuit board, such as shown at 12, with other segments and/or circuitry of the particular electrical or electronic apparatus (not shown). Such apparatus may be a television or radio receiver, communications equipment or other electrical or electronic gear. The advantage of such an approach is that the printed circuit boards may be fabricated as separate and independent modules in the production process and incorporated in the intended apparatus whenever appropriate or convenient without additional soldering or other assembly steps being required. Moreover, the module may be conveniently removed for servicing or the like at any time subsequent to assembly.

Printed circuit board 12 is intended to be illustrative of printed circuit boards generally. Board 12 is shown as having a plurality of conductive paths or strips 14 which terminate in associated tab members 16 positioned along one edge thereof as shown at 18. The electrical components (not shown) are mounted on the reverse side of board 12 with the electrical leads thereof extending through the plurality of apertures, as illustrated, prior to dip-soldering or other process for permanently affixing the component leads to the conductive paths or strips 14. The printed circuit board 12 is then ready for insertion within a connector assembly where suitable interconnection is established between the respective connection tabs 16 and the desired portions of the circuitry in the electrical apparatus via corresponding contacts of the connector assembly, such as that as shown at 10 in FIG. 1.

Figure 2:
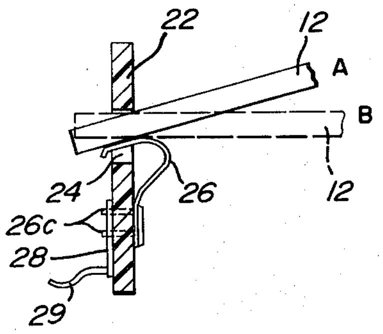
FIG. 2 is a cross-sectional view of the connector assembly of FIG. 1 taken substantially along the lines 2—2 wherein the associated printed circuit board is illustrated in two relative positions.
Figure 6:
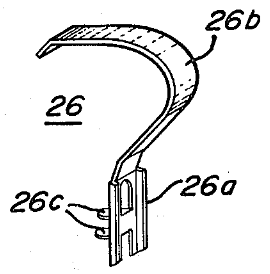
FIG. 6 is an enlarged view in perspective one of the resilient contact spring members incorporated in one embodiment of the connector assembly.

Connector 10 includes a support frame 22 with a rectangular slot or opening therein as identified generally at 24. A plurality of electrical contact members 26 are positioned in close proximity to the opening 24. As best seen in FIG. 6, each of the electrical contact members 26 are fabricated in a U-shaped or "question mark" configuration, having a base portion **26*a* from which an arcuate portion 26*b* extends upwardly therefrom in the manner illustrated. A pair of projections or terminal fingers 26*c* extend inwardly from the base 26*a*, which fingers are intended for effecting attachment of the contact member to the connector body, such as by soldering or the like. Finger members 26*c* extend through appropriate channels or apertures in the connector body and also a conductive strip 28 positioned on the interior surface thereof, as shown in FIG. 2. An electrical lead 29 is utilized to interconnect the conductive strip 28** and some desired portion of the associated electrical apparatus (not shown).

Electrical contact members 26 are formed of a conductive but suitably resilient spring material wherein the forward arcuate portion **26*b* is in the form of a flat strip or ribbon configuration to provide adequate contact surface with a corresponding connection tab 16 on printed circuit board 12, and thus insure a low resistance connection point therebetween. The arcuate portion 26*b* extends into the slot 24 of the connector body 22 as illustrated in FIGS. 1 and 2. Slot 24 is of a dimension laterally wherein the printed circuit board 12, which when positioned substantially as that identified at position "A" in FIG. 2, will effectively clear the contact spring members 26. As such and in such relative position, printed circuit board 12 requires substantially zero insertion force with all of the attendant advantages thereof. Side extensions or wings 19 on printed circuit board 12 contact side portions 22*a* of the connector body 22 to thus act as stops when printed circuit board 12 is inserted into the connector assembly 10.**

Although the printed circuit board 12 is in an engaged position with connector 10 when placed in position "A," proper electrical interconnection between the board connection tabs 16 and contact spring members 26 is not fully established. However, such may be obtained simply and expediently by pivoting printed circuit board 12 downwardly to a second position, i.e., position "B," substantially normal to the connector body 22, as shown in FIG. 2. In this position, the respective connection tabs 16 on printed circuit board 12 press downwardly onto their respective contact spring members 26. The resultant contact pressure insures good electrical contact with minimum resistance. Suitable means may then be included to lock or otherwise maintain the printed circuit board 12 in its fully horizontal position as depicted at position "B" in FIG. 2.

Figures 3, 4:
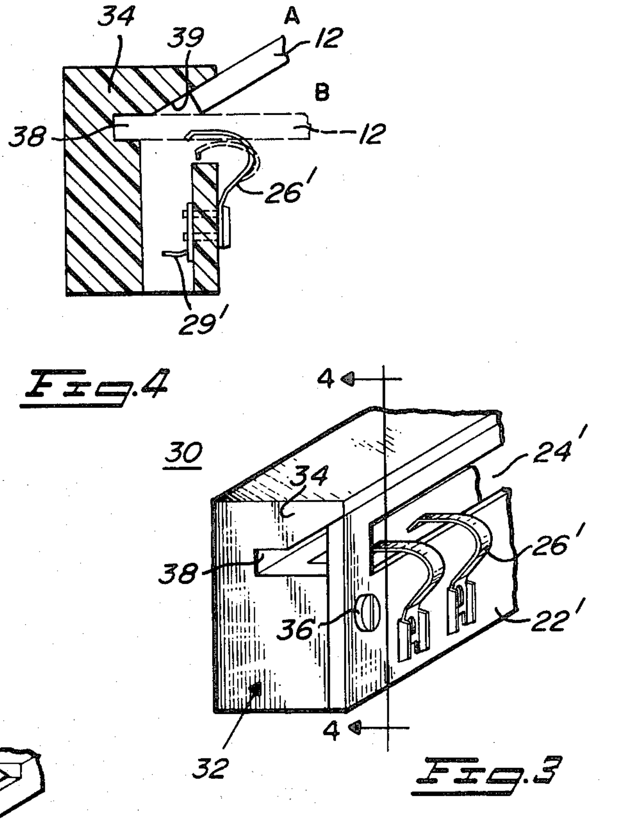
FIG. 3 is a partial view in perspective of another embodiment of the printed circuit board edge connector assembly.
FIG. 4 is a cross-sectional view in elevation of the connector assembly of FIG. 3 taken substantially along lines 4—4.

Another embodiment of the present invention is shown in FIG. 3. In this instance, a connector assembly is shown at 30 which includes a two piece support frame 32. A front support member 22′ is substantially as that shown at 22 in FIG. 1, with the exception that the top portion thereof is beveled to fit a corresponding beveled edge of a back support member 34. Support members 22′ and 34 may be suitably fastened together, such as by machine screws 36, to form a composite unit.

Support member 34 includes a key slot 38 in the interior of the back wall thereof along its longitudinal axis, substantially as that shown in FIGS. 3 and 4. A projection of the top wall extends outwardly over the key slot 38 with an upwardly slanting face or interior surface 39. This slanting surface provides an effective guideway for the printed circuit board 12 when inserted in the opening 24′ between surface 39 and the spring contact members 26′, such as that depicted at position "A" in FIG. 4. Since printed circuit board clears the contact members 26′, zero insertion force is required for the insertion thereof, or more properly edge portion 18, into the connector assembly 30. After edge 18 is properly seated within key slot 38, the printed circuit board 12 again may be pivoted downwardly to the position "B" which is substantially normal to the connector assembly 30. In this position, contact members 26′ are pressed downwardly by the respective connecting tabs 16 on the printed circuit board such as indicated in phantom line in FIG. 4, and thus effect an interconnection therebetween of optimized low resistance. Again any suitable means may be utilized to maintain or lock the printed circuit board 12 in this fixed position. The deflection of contact members 26′ insures the desired contact pressure will be maintained between the connecting tab 16 of board 12 and the spring contact members 26′.

Figure 5:
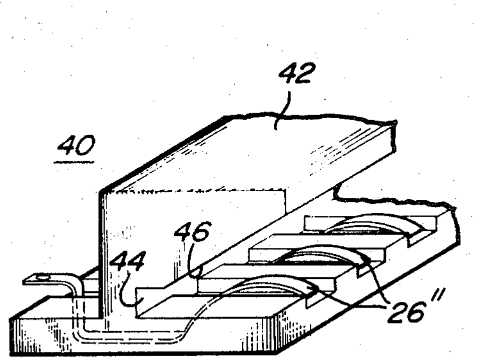
FIG. 5 is a partial view in perspective of still another embodiment of the printed circuit board edge connector.

Still another embodiment of the present invention is shown in FIG. 5. In this embodiment, a connector assembly 40 is shown which includes a single connector body 42 having a key slot 44 along its longitudinal axis and wherein the top wall extends outwardly therefrom with an upwardly slanting surface 46 in substantially the same way as that described for the embodiment of FIGS. 3 and 4. In this instance contact spring members, identified at 26'', are positioned in slots or compartments running laterally across the bottom of the connector body 42. Contact springs 26'' extend downwardly within formed channels and then up and out of the rear of the connector body 42 in the manner as illustrated.

As will be readily appreciated, printed circuit board 12 is accommodated within connector assembly 40 in substantially the same way as that previously described in connection with connector 30 as shown in FIGS. 3 and 4. That is, when circuit board 12 is inserted at a predetermined angle such that its planar surface is substantially parallel to slanting surface 46, zero insertion force is required because board 12 clears the contact spring members 26''. With the forward edge of printed circuit board 12 properly seated within slot 44, board 12 may be pivoted downwardly whereby pressure is effectively exerted on contact spring members 26'' to establish the desired low resistance connection point therebetween. Such connection will be maintained as long as circuit board 12 remains in its substantially horizontal, fixed position.

Accordingly, a printed circuit board edge connector is provided which requires zero force for the insertion of the associated printed circuit board and consequently does not give rise to the abrasive wear on the electrical contact surfaces which so often results when they are slid over one another under pressure or other clamping force. As a result, reliability and service life are effectively increased, tolerances, such as board thickness, may be substantially relaxed, and misalignment problems are thereby avoided. At the same time, the connector assembly is relatively uncomplicated, economical in cost, and readily adaptable for any circuit application.

While only certain embodiments have been herein shown and described, it will of course be understood that various modifications and alternate constructions may be made without departing from the true scope and spirit of the invention. It is to be understood that the appended claims are intended to cover all such modifications and alternate constructions as fall within their true scope and spirit.

What is claimed is:

1. An edge connector for effecting electrical connection to an inserted printed circuit board having a plurality of connection tabs arranged along one edge thereof, and wherein substantially zero insertion force is required in inserting the circuit board, said connector assembly comprising in combination:

a connector body of electrical insulating material having a detachable front portion with an access opening therein extending along the longitudinal axis thereof for receiving and supporting said edge portion of said printed circuit board, and a second body portion having a key slot running along the longitudinal axis thereof in substantial alignment with said frontal access opening, said second body portion further having an inclined surface overhanging said key slot and serving as a guideway for the insertion of said printed circuit board;

a plurality of contact members of resilient and electrically conductive material mounted on said connector body adjacent said frontal opening;

said contact members being arranged to present a non-contacting relation to said connection tabs on said printed circuit board when the circuit board is being inserted at a predetermined angle with reference to said connector body, but firmly engaging respective ones of said connection tabs when the circuit board is thereafter pivoted to a position substantially normal to said connector body front face; and means for maintaining said printed circuit board in a fixed position relative to said connector body, when inserted therein.

2. An edge connector for effecting electrical connection to an inserted printed circuit board having a plurality of connection tabs arranged along one edge thereof, and wherein substantially zero insertion force is required in inserting the circuit board, said connector assembly comprising in combination:

a connector body of electrical insulating material having a front face with an access opening therein extending along the longitudinal axis thereof for receiving and supporting said edge portion of said printed circuit board;

a plurality of contact members of resilient and electrically conductive material mounted on said connector body adjacent said frontal opening, said contact members being fabricated in a generally U-shaped configuration having one of the legs serving as a base portion for mounting to said connector body, said contact members being arranged to present a non-contacting relation to said connection tabs on said printed circuit board when the circuit board is being inserted at a predetermined angle with reference to said connector body, but firmly engaging respective one of said connection tabs when the circuit board is thereafter pivoted to a position substantially normal to said connector body frant face;

conductive strips positioned on the interior of said connector front portion, one for each of said contact members, with each of said contact members including at least one projecting tab extending from said base portion through an associated aperture in said connector to a respective one of said conductive strips; and means for maintaining said printed circuit board in a fixed position relative to said connector body, when inserted therein.

* * * * *